(12) United States Patent
Durst et al.

(10) Patent No.: US 10,784,078 B2
(45) Date of Patent: Sep. 22, 2020

(54) ELECTRON DIFFRACTION IMAGING SYSTEM FOR DETERMINING MOLECULAR STRUCTURE AND CONFORMATION

(71) Applicant: Bruker AXS GmbH, Karlsruhe (DE)

(72) Inventors: Roger D. Durst, Pfinztal (DE); Christoph Ollinger, Karlsruhe (DE)

(*) Notice: Subject to any disclaimer, the term of this patent is extended or adjusted under 35 U.S.C. 154(b) by 0 days.

(21) Appl. No.: 16/176,639

(22) Filed: Oct. 31, 2018

(65) Prior Publication Data

US 2020/0135424 A1    Apr. 30, 2020

(51) Int. Cl.
*H01J 37/295* (2006.01)
*H01J 37/20* (2006.01)
*H01J 37/26* (2006.01)
*H01J 37/28* (2006.01)

(52) U.S. Cl.
CPC .......... *H01J 37/2955* (2013.01); *H01J 37/20* (2013.01); *H01J 37/26* (2013.01); *H01J 37/265* (2013.01); *H01J 37/28* (2013.01); *H01J 37/295* (2013.01)

(58) Field of Classification Search
None
See application file for complete search history.

(56) References Cited

U.S. PATENT DOCUMENTS

| | | | | |
|---|---|---|---|---|
| 2010/0187433 A1* | 7/2010 | Eastham | ................ | B82Y 15/00 250/396 R |
| 2010/0252735 A1* | 10/2010 | Hytch | ..................... | H01J 37/26 250/311 |
| 2011/0220796 A1* | 9/2011 | Nicolopoulos | ..... | H01J 37/2955 250/307 |
| 2012/0001068 A1* | 1/2012 | He | ........................ | H01J 37/265 250/307 |

(Continued)

FOREIGN PATENT DOCUMENTS

| | | |
|---|---|---|
| EP | 1503399 A1 | 2/2005 |
| EP | 2402976 A1 | 1/2012 |

(Continued)

OTHER PUBLICATIONS

Koster et al., Perspectives of Molecular and Cellular Electron Tomography, Journal of Structural Biology (Year: 1997).*

(Continued)

*Primary Examiner* — Michael J Logie
(74) *Attorney, Agent, or Firm* — Benoit & Côté Inc.

(57) ABSTRACT

An electron diffraction imaging system for imaging the three-dimensional structure of a single target molecule of a sample uses an electron source that emits a beam of electrons toward the sample, and a two-dimensional detector that detects electrons diffracted by the sample and generates an output indicative of their spatial distribution. A sample support is transparent to electrons in a region in which the sample is located, and is rotatable and translatable in at least (Continued)

two perpendicular directions. The electron beam has an operating energy between 5 keV and 30 keV, and beam optics block highly divergent electrons to limit the beam diameter to no more than three times the size of the sample molecule and provide a lateral coherence length of at least 15 nm. An adjustment system adjusts the sample support position in response to the detector output to center the target molecule in the beam.

18 Claims, 4 Drawing Sheets

(56) References Cited

U.S. PATENT DOCUMENTS

2017/0309441 A1* 10/2017 Flanagan, IV ........ H01J 37/265
2019/0035616 A1* 1/2019 Longchamp ....... G01N 23/2251

FOREIGN PATENT DOCUMENTS

| WO | 2015022510 A1 | 2/2015 |
| WO | 2017118494 A1 | 6/2016 |

OTHER PUBLICATIONS

Qu et al. "Nanometer-localized multiple single-molecule florescence microscopy" (Year: 2004).*

Latychevskaia, "Spatial coherence of electron beams from field emitters and its effect on the resolution of imaged objects" (Year: 2017).*

Zhang et al., "Collecting 3D electron diffraction data by the rotation method" (Year: 2010).*

Gemmi et al. "3D electron Diffraction: the Nanocrystallography Revolution" (Year: 2019).*

Wood, John A. et al., "Iridium single atom tips fabricated by field assisted reactive gas etching", Applied Surface Science, vol. 367, Mar. 30, 2016, pp. 277-280.

Spence, J.C.H. et al., "Single Molecule Diffraction", Physical Review Letters vol. 92, No. 19, 2004.

Fill, E.E. et al., "Single-molecule electron diffraction imaging with charge replacement", New Journal of Physics 10 (Jul. 2, 2008) 093015.

Zan, R. et al., "Control of Radiation Damage in MoS2 by Graphene Encapsulation", ACS Nano, vol. 7, No. 11, 2013, pp. 10167-10174.

Henderson, R., "The potential and limitations of neutrons, electrons and X-rays for atomic resolution microscopy of unstained biological molecules", Quarterly Reviews of Biophysics, Jun. 1995, pp. 171-193.

Sanche, L., "Low energy electron-driven damage in biomolecules", The European Physical Journal D, 35, 2005, pp. 367-390.

Folkard, M. et al. "Measurement of DNA damage by electrons with energies between 25 and 4000 eV", Int. J. Radiat. Biol., 1993, vol. 64, No. 6, pp. 651-658.

Zhang, Daliang, et al., "Precession electron diffraction using a digital sampling method", Ultramicroscopy 111, pp. 47-55, Sep. 2010.

Latychevskaia, Tatiana et al., "Holography and coherent diffraction with low-energy electrons: A route towards structural biology at the single molecule level", Ultramicroscopy, vol. 159, Dec. 2, 2014.

* cited by examiner

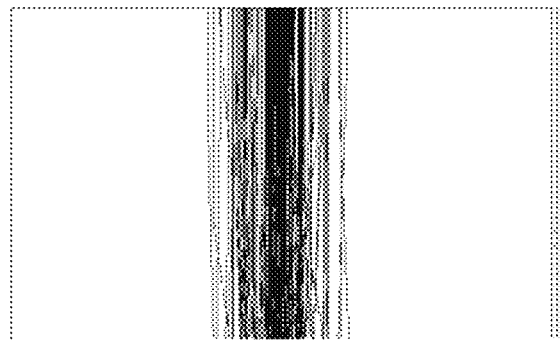
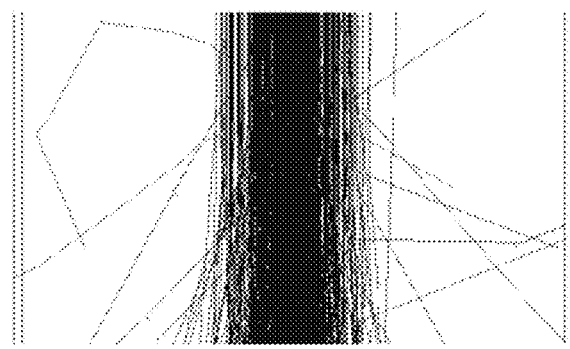
FIGURE 2A  FIGURE 2B
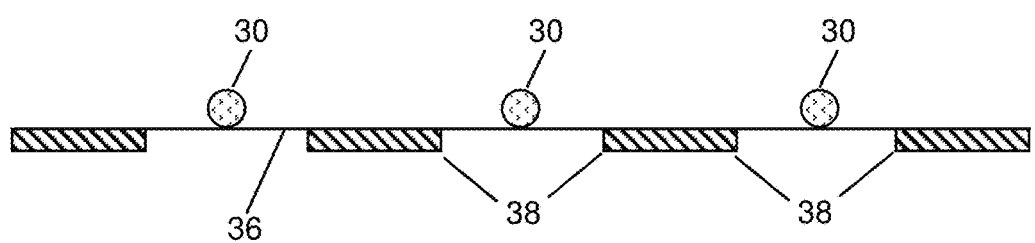
FIGURE 4

ELECTRON DIFFRACTION IMAGING SYSTEM FOR DETERMINING MOLECULAR STRUCTURE AND CONFORMATION

BACKGROUND OF THE INVENTION

Field of the Invention

This invention relates generally to the field of electron imaging and, more particularly, to the imaging of biological molecules for determining both structure and conformation.

Description of the Related Art

Determining the structure of large molecules, particularly biomolecules, by conventional means is complicated by the fact that such molecules may be intrinsically disordered or take more than a single conformation. Traditional measurement techniques are incapable of providing all of the details regarding a single molecule. Nevertheless, as many biologically relevant processes depend on conformational changes of biomolecules, it would be highly desirable to have the means to determine all of the structural details of a single molecule.

X-ray crystallography has been the method of choice in recent years for solving the atomic structure of biomolecules. With more brilliant x-ray sources being available through synchrotron radiation and free electron lasers, it became possible to solve structures of molecules where the crystallization was hard to achieve and only small nano-sized crystals could be generated. However, crystallography requires crystallization of the molecules, and many biological molecules are difficult or impossible to crystallize, making them poor candidates for X-ray crystallographic solution.

Coherent X-ray diffraction has also been used in the past to examine the three-dimensional structure of nanoscale objects. In this method, a sample is irradiated with a beam of coherent X-rays and rotated relative to the X-ray beam so as to collect a set of two-dimensional images. These images are then inverted to determine the three-dimensional electron density profile. However, this method is not amenable to the examination of biological macromolecules because the radiation damage caused by X-rays is much too severe. That is, a single molecule will be completely destroyed by X-rays long before enough information can be collected to solve the structure.

Nuclear magnetic resonance (NMR) spectroscopy can also be used to characterize biological molecules, and does not require crystallization. However, it is currently limited to relatively small molecules, typically below about 30 kDa in size. As such, at least 70% of eukaryotic proteins are not amenable to solution by NMR.

Cryo-electron microscopy ("cryo-EM"), like NMR, does not require crystallization, and is particularly well-suited to solving large proteins and protein complexes. However, cryo-EM also has a size limit and, currently, molecules smaller than about 80 kDa cannot be solved using this technique.

In addition to these limitations, biological molecules that are intrinsically disordered or that take more than a single conformation are not amenable to either Cryo-EM or X-ray crystallography. Such highly flexible molecules can be characterized using NMR but, as noted above, NMR is only able to determine the structure of relatively small molecules. Therefore, a large class of biologically interesting molecules, namely, large flexible proteins are not amenable to any extant structure solution technique.

In addition to the foregoing, most existing structure solution techniques require relatively large amounts of purified protein. This requires that the protein be first cloned and expressed in large amounts by a so-called expression system (a cell culture specifically optimized for expressing proteins). However, not all proteins can be readily cloned and expressed. Even for those proteins that can be readily cloned and expressed, preparation of samples for crystallography or cryo-EM can take months, including the time to clone, express and purify the target protein and to then prepare either diffraction-quality crystals (for crystallography) or high-quality, monodispersed Cryo-EM grids.

The technique known in the art as coherent diffraction imaging (CDI) has been used with large scale x-ray facilities like synchrotrons and free electron lasers with sufficient coherence length. However, the probe intensities necessary to achieve atomic resolution are high enough to cause ionization of many biomolecules, resulting in a subsequent coulomb explosion. It has been proposed to solve the structure of a single molecule in the few femtoseconds before the molecule explodes, but this has not yet been achieved in practice. This limits the applicability of the CDI technique, making it currently appropriate only for nano-sized, radiation-hard samples. Moreover, while technological improvements could eventually allow CDI to be applied to single molecules, current CDI techniques are only able to determine the two-dimensional structure of a molecule. Thus, such a system would still require that the data from many identical molecules be merged in order to determine a three-dimensional structure.

SUMMARY OF THE INVENTION

In accordance with the present invention, an electron diffraction imaging system is provided for imaging the three-dimensional structure of single molecule samples. An electron source is provided that emits a beam of electrons in a first direction toward the sample and, in an exemplary embodiment, has an operating energy between 5 keV and 30 keV. The source may include beam conditioning optics that limit the beam diameter to no more than three times the size of the sample molecule, and that may operate by blocking highly divergent electrons emitted by the source. In one embodiment, the electron beam has a lateral coherence length of at least 15 nm.

A two-dimensional electron detector detects electrons diffracted by the sample and generates an output indicative of the spatial distribution of the diffracted electrons. The sample is located on a sample support that is substantially transparent to electrons in a region of the support in which the sample is located. The sample support is configured to allow its translation in at least two perpendicular directions and to rotate the sample to different angular orientations. An adjustment system may also be provided that adjusts the translation of the sample support in response to the detector output so as to keep the single molecule sample substantially centered in the electron beam and/or to maximize a detected diffraction intensity. In one version, the adjustment system is controlled to maintain a sphere of confusion of less than 30 nm.

In the exemplary embodiment, the electron source, detector and sample support are each located in an evacuated environment. In particular, the source may be located in an ultra high vacuum environment of $10^{-9}$ mbar or less. The sample support may be located in a vacuum of $10^{-6}$ mbar or less. In order to allow a low degree of occlusion of the electron beam during rotation of the sample support, the support may be constructed with a very low aspect ratio. In one embodiment, the support has a substrate that is transparent to electrons and a rigid support structure to which the substrate is mounted. The support structure, which may be a grid, has an opening adjacent to a region on which the sample is located, and an overall thickness of the sample support relative to the size of the opening is such that, during a 360° rotation of the sample support, an angle over which the electron beam is occluded by the support structure is less than five degrees.

BRIEF DESCRIPTION OF THE DRAWINGS

FIG. 2A is a depiction of electron scattering in a 10 nm thick polymer layer at a beam energy of 20 keV.

FIG. 2B is a depiction of electron scattering in a 10 nm thick polymer layer at a beam energy of 5 keV.

FIG. 4 is a schematic view of a sample support used with the present invention, which includes a substrate transparent to electrons mounted to a support grid.

DETAILED DESCRIPTION

Figure 1:
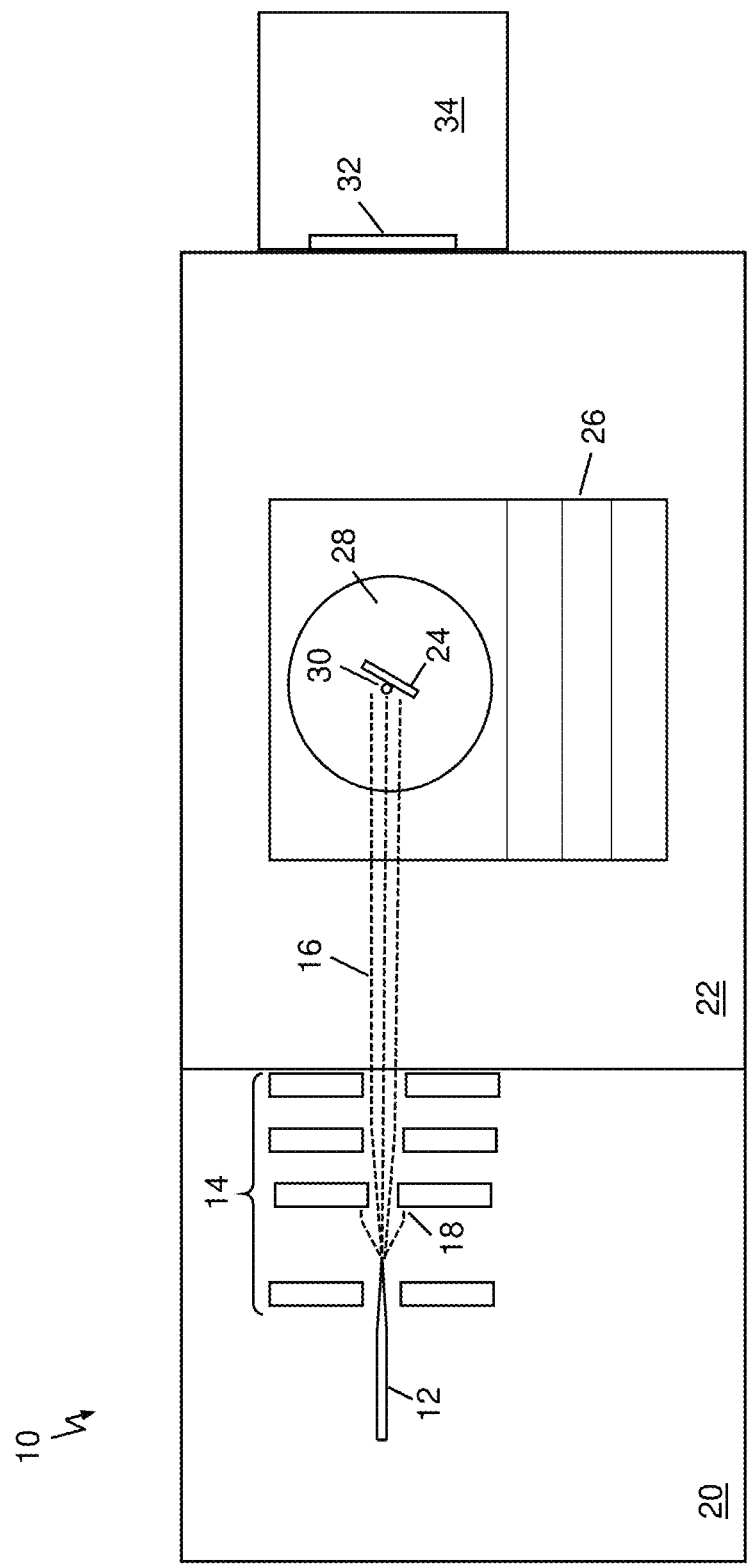
FIG. 1 is a schematic view of an electron diffraction imaging system according to the present invention.

FIG. 1 is a schematic view of an exemplary embodiment of a coherent electron diffractometer 10 according to the present invention. Coherent electron emitter 12 may be any one of several different emitters capable of generating a beam of coherent electrons. An example of such an emitter uses a single-atom tip, as described by Wood et al. in the article "Iridium single atom tips fabricated by field assisted reactive gas etching," *Applied Surface Science*, Volume 367, 30 Mar. 2016, Pages 277-280. Emitters of this type are known to provide relatively large coherence length and relatively long operating lifetimes. However, other coherent electron emitters may also be used, such as tungsten nanotip and lanthanum hexaboride nanowire emitters.

Emitter 12 is coupled to collimating electron optics 14. In this embodiment, the optics are electrostatic, extracting electrons from the emitter and collimating them into a beam 16 having a diameter of approximately 2-3 times the size of the target molecules (e.g., in the range of 50 to 300 nm). A beam with a larger diameter may be used, but it is preferred that the beam be less than ten times the size of the target molecule (e.g., 1000 nm), as larger beam diameters result in more scattered electron noise. Such electron noise reduces the signal-to-noise ratio and would therefore require longer exposure times.

In the FIG. 1 configuration, the optics are designed to produce a beam with energy in the range of 5-30 keV, with a range of 10-20 keV being used in an exemplary embodiment. Keeping the operating energy below 30 keV minimizes displacement radiation damage of biological molecules. However, if the energy is too low, then the scattering of the electrons becomes too high, leading to attenuation of the diffraction signal and an increase in the scattered noise background. Thus, the beam energy is preferably a minimum of 5 keV. This is demonstrated by the electron scattering plots of FIGS. 2A and 2B. FIG. 2A depicts electron scattering in a 10 nm thick polymer layer at a beam energy of 20 keV, which simulates scattering in a typical protein. As shown, there is very little electron scattering at this energy level. In contrast, FIG. 2B depicts electron scattering in an identical polymer layer at a beam energy of 5 keV, which results in a lower diffraction signal and a higher degree of scattering.

Figure 3A:
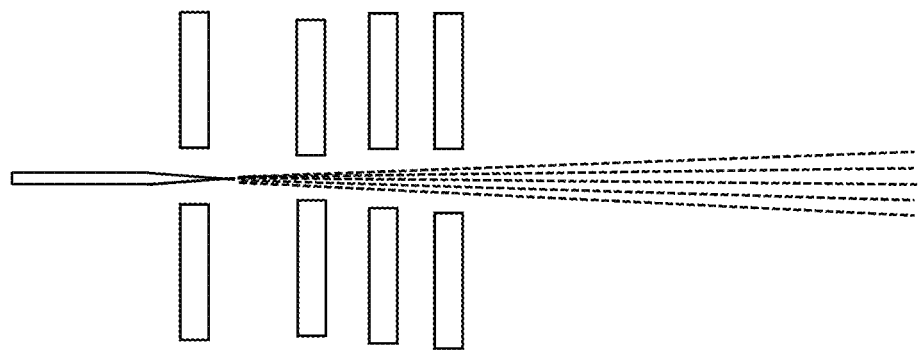
FIG. 3A is a schematic view of an electron beam nanoemitter in which all of the electrons emitted are collimated into the electron beam.
Figure 3B:
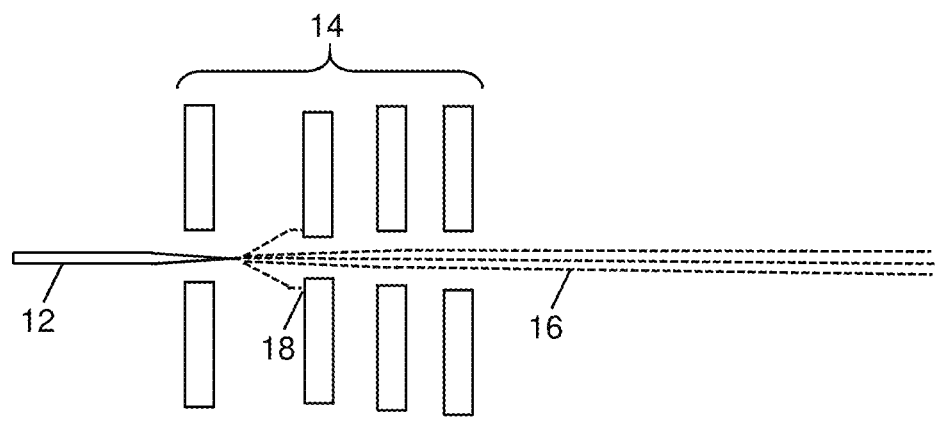
FIG. 3B is a schematic view of an electron beam nanoemitter used with the present invention, in which the coherence of the beam is optimized by occulting the emission angles higher than about 3 degrees or less.

Also shown in FIG. 1 is a portion 18 of the optics 14 that is arranged to block highly divergent electrons from the edges of the emitter. Blocking of these divergent electrons improves the effective coherence length of the electron beam, which allows smaller samples, such as single molecule samples, to be examined. FIG. 3A shows schematically a nanoemitter in which all of the electrons emitted are collimated into the electron beam. Such a nanoemitters would typically emit into a solid angle of 5-8 degrees, and the coherence is highest for those electrons emitted closest to the tip (where the virtual source size is smallest). In the present invention, however, the coherence of the beam is optimized by occulting the emission angles higher than about 3 degrees or less, as shown schematically in FIG. 3B.

As low energy electrons will not propagate in air, the entire diffractometer is located in an evacuated environment. The emitter 12 and optics 14 of the system of FIG. 1 are located in a source vacuum chamber 20, which is pumped to an ultra high vacuum (UHV) (i.e., to a pressure of less than $10^{-9}$ mbar). This low pressure maximizes an operating lifetime of the source as it minimizes ion impact which might otherwise etch the emitter tip. Adjacent to the source chamber 20 is sample vacuum chamber 22, in which the sample to be examined is located. The sample chamber 22 may be operated at a somewhat higher pressure (high vacuum (HV) in the range of $10^{-6}$ mbar), which is less costly than operating a UHV chamber and improves serviceability due to reduced pump down times.

Located in the sample chamber 22 is a sample support 24 on which the sample may be mounted. The support 24 must be highly transparent to low energy electrons in the vicinity of the sample, and should have a high electrical conductivity to prevent charging. In the FIG. 1 embodiment, the support has a substrate of graphene or a derivative thereof. Certain graphene substrates have been used in various fields in the past but, as discussed in more detail below, the substrate for the present invention is adapted to single molecule examination.

The sample support 24 is located on a sample stage that includes a translation stage 26 and a rotation stage 28. The translation stage 26 may be a two axis (XY) stage or a three axis (XYZ) stage, and is controlled to adjust the position of the sample to align it with the electron beam. The translation stage is vacuum compatible and has nanometer resolution and accuracy. In the present embodiment, the translation stage 26 is piezoelectric, although others means of control are also possible. In the present embodiment, the translation and rotation stages are part of a goniometer to which the sample support is mounted.

The translation stage 26 supports the rotation stage 28, which is controlled to rotate the sample within the electron beam. The rotation stage 28 may have a single axis of rotation, or may allow for two orthogonal degrees of rotation. In the embodiment of FIG. 1, the rotation stage supports a full 360° rotation, although a rotation stage with a limited angular range may also be used. The rotation stage has a very small sphere of confusion (SOC), on the order of a fraction of the size of the beam, which typically means a SOC on the order of, at most, a few tens of nanometers. As maintaining such a small SOC is very challenging, active feedback is preferably used to minimize the SOC. In the exemplary embodiment, every time the sample is rotated by a small angle (which, in turn, can translate the sample a small distance relative to the beam), the sample is recentered in the beam using the translation stage 26, as discussed in more detail below.

Minimizing the SOC and maintaining the sample molecule centered in the beam ensures that the measured signal for each of the rotation steps is maximized. In the present embodiment, the number of rotation steps may be selected by the user, although it is anticipated that several hundred steps may be desirable to provide a full characterization of the sample molecule.

As shown in FIG. 1, a sample 30 is located on the sample support 24 in the path of the electron beam 16. Those skilled in the art will understand that the components in the figure are not shown to scale but, rather, are depicted so as to best describe the invention. Electrons diffracted by the sample are detected by electron detector 32. The detector has an active area that is large enough to collect the entire diffraction pattern, and a pixel size that is sufficiently small to provide a reconstruction resolution on the order of two Angstroms or better. In an exemplary version, the detector has an active area of between 5×5 cm$^2$ and 10×10 cm$^2$, and a pixel size of between 50 μm and 100 μm.

The pixel size of the detector should be made relative to the dimensions of the system itself. For example, the energy of the electron beam may first be selected such that it is high enough to produce a clear diffraction signal, but low enough to minimize damage to the molecule itself. In the exemplary embodiment, the relationship between the pixel size, wavelength, detector distance and sample size is given by the following:

pixel size=(distance)(wavelength)/(2)(sample size)

This relation takes into account the diffraction limit in the coherent diffraction imaging system itself. Some possible combinations meeting these criteria are shown in the following table:

| Resolution (Å) | Min. # of pixels | Energy (keV) | Min. dist. (mm) | Max. dist. (mm) |
|---|---|---|---|---|
| 2.0 | 500 | 5 | 390 | 800 |
|  |  | 8 | 500 | 1000 |
|  |  | 25 | 880 | 1800 |
| 1.5 | 700 | 5 | 390 | 600 |
|  |  | 8 | 500 | 750 |
|  |  | 25 | 880 | 1350 |
| 1.0 | 1000 | 5 | 390 | 395 |
|  |  | 8 | 500 | 500 |
|  |  | 25 | 880 | 900 |

Thus, as an example, for 8 keV electrons having a deBroglie wavelength of λ=0.14 Å, a resolution of approximately 2 Å with a sample size of 10 nm may be achieved for a pixel size of 70 μm. Using the Shannon sampling theorem (for 500 pixels), this gives a detector size of 3.5 cm.

In the exemplary embodiment, the detector has a single electron sensitivity, so as to minimize the radiation fluence to the sample. In the exemplary embodiment, the detector has a dynamic range of about 10$^6$ so as to allow collection of the entire range of diffracted intensities. In an alternative embodiment, the detector may have a dynamic range of less than 10$^5$, and a beamstop is used to occlude the central beam. In such a case, the beamstop should be as small as possible, while still blocking the central beam, since low order diffraction near the beamstop is important to the structure solution. The detector surface is preferably in the vacuum environment of chamber 22, and is connected to readout electronics 34 that are located outside of the vacuum environment. This arrangement simplifies the cooling of the electronics and servicing of the detector. One specific version uses an electron detector consisting of a scintillator screen that is coupled via a fiber optic window to a high sensitivity camera that is optimized for an electron counting operation.

As mentioned above, the substrate of the sample support should be highly transparent to low energy electrons in the vicinity of the sample and highly conductive. In the embodiment of FIG. 1, the substrate is monoatomic graphene, although a graphene derivative that is optimized for three-dimensional imaging may also be used. As discussed below, to maximize a measurement range, a sample support with a very low aspect ratio is used.

For simplicity, FIG. 1 shows a single sample 30 located on substrate 24. In an exemplary version of this embodiment, however, the support can hold many samples. These samples may be spaced out across the support surface at regular intervals, as shown in FIG. 4, which is an enlarged, schematic view of a sample support that may be used with the embodiment of FIG. 1. The support includes a graphene layer 36 that resides on a grid 38 consisting of a strong, stiff material having a conductive exterior to improve the electrical contact with the graphene layer. In the exemplary embodiment, silicon nitride that is coated with a conductive metal, such as gold, is used to provide the desired rigidity and conductivity. Other materials such as graphite, silicon nitride or aluminum nitride coated with a conductive outer layer may be used as well. It is also possible to use a conductive metal (e.g., copper) as the grid material, but it would require a greater thickness due to its lack of rigidity which, in turn, would increase the occlusion of the electron beam by the grid layer.

Samples 30 reside on the graphene layer, and the electron beam passes through the spaces between the grid portions 38. The grid is made very thin so that, when the sample support is rotated, there will be very little occlusion of the electron beam. In the exemplary embodiment, the grid 38 has openings of approximately 10 μm or more and a thickness of less than 0.5 μm, providing an angular field of view of at least 170°. In the exemplary embodiment, the samples 30 are located at the center of their respective spaces between the grid portions so as to minimize occlusion of the beam. Precise positioning of the samples in this respect may be accomplished, for example, by nanopipetting a very small amount of dilute protein solution onto the center locations of the grid openings using hollow atomic force microscopy (AFM) tips.

Figure 5:
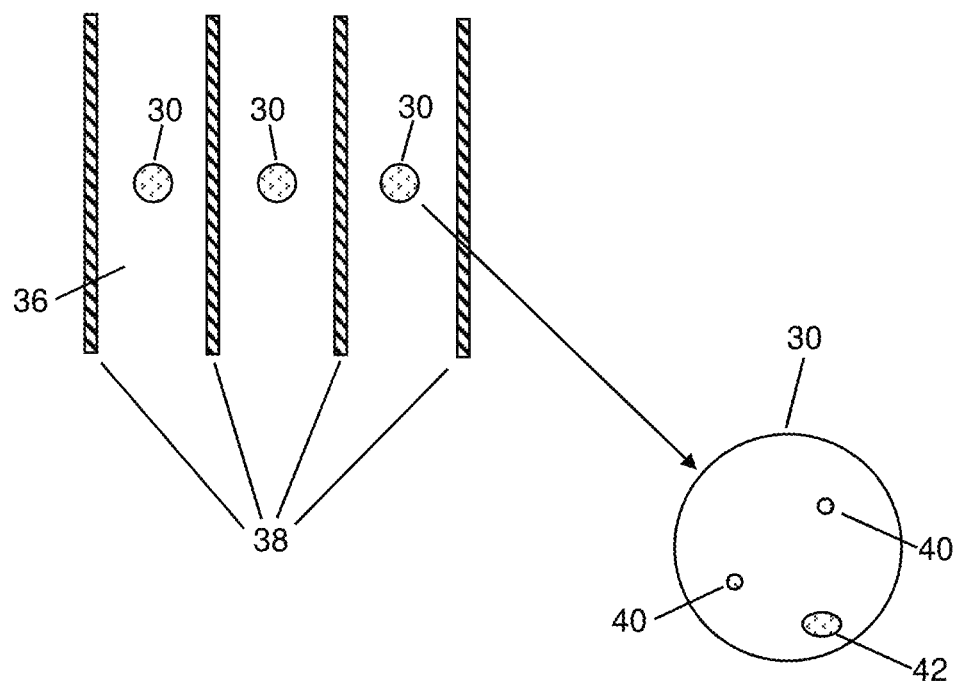
FIG. 5 is a schematic top view of a portion of a sample support showing an enlarged representation of a protein nanodroplet.

The location and centering of a target molecule in accordance with the invention may be done in different ways. FIG. 5 is a schematic top view of a portion of a sample support having a substrate 36 and a grid 38, as well as an enlarged view of one of the samples 30 located on a substrate. In this example, the sample 30 is a protein nanodroplet having a diameter of less than 1 μm, which may contain multiple target molecules of interest. As the molecules may be randomly distributed within the droplet, it is necessary to select a desired molecule and position it in the center of the electron beam. It is also necessary to distinguish the molecules from any possible contaminant 42, such as a dust particle or a salt crystal from the protein solution.

In one embodiment, target molecule location may be accomplished by operating the system in point projection microscopy mode to produce a shadowgraph, in which the molecules will appear as dark patches. The size and shape of these patches may be interpreted by a user to distinguish between actual target molecules 40 and possible contaminants 42, particularly since the approximate size of a target molecule can be estimated from its genetic sequence. In order to provide sufficient detail, each shadowgraph will cover only a small region of the substrate, and the translation stages of the system may be used to move the substrate in two dimensions to obtain point projection shadowgraphs of other regions.

In another embodiment, an electron beam is collimated and scanned across the sample substrate in two dimensions, while diffracted and transmitted electrons are detected by a detector. When the beam scans over a target molecule, there will be a detectable diffracted electron signal. The distribution of this electron signal is determined by the convolution of the electron beam size with the molecule size. If the beam size is larger than the molecule size, the two-dimensional distribution of diffracted electron intensity will be larger than the molecule. The geometric centroid of this distribution can then be computed to locate the molecule with a precision better than the size of the beam, as shown schematically in FIG. 6.

Figure 6:
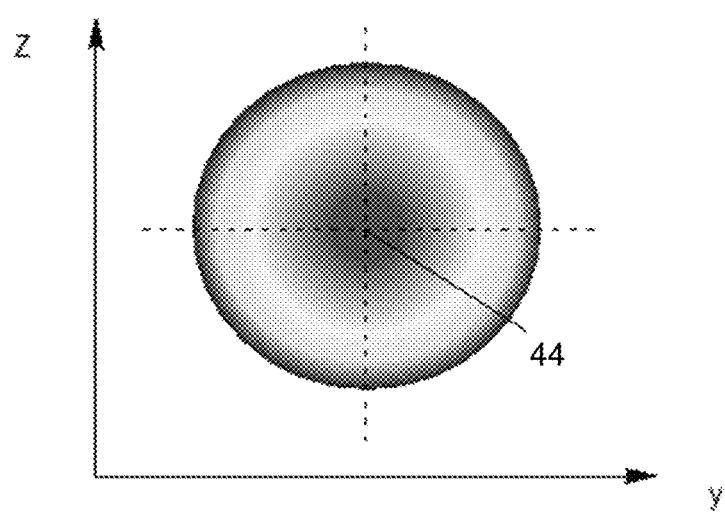
FIG. 6 shows a spatial distribution of electron energy diffracted from a sample molecule, which may be used for centering of the molecule in the electron beam.

The example distribution of shown in FIG. 6 represents diffracted electron intensity versus scan position in the y-z plane. This distribution is a two-dimensional map of intensity relative to position in this plane, and the centroid 44 of the distribution can be calculated to give the position of the target molecule. Moreover, assuming that the beam size is comparable to the size of the molecule, the known beam width can be deconvolved from the two-dimensional intensity map to determine the approximate size and shape of the molecule. If the approximate size of the molecule is known from its genetic sequence, this information can also be used to distinguish the molecule from any unwanted contaminant.

In an alternative approach, the size of the molecule can be estimated from the diffraction pattern collected near the centroid position. That is, an autocorrelation function of the measured diffraction pattern provides an estimate of the molecule size.

During the determination of the molecule structure, the molecule is rotated relative to the sample beam using the rotation stage 28 shown in FIG. 1. In general, the rotation of the molecule will also cause it to be translated relative to the electron beam and the translation stages are therefore used during this process to keep the molecule centered in the beam. This may be done using the centroid locating process discussed above, such that each time the sample molecule is rotated, the centroid of the diffracted electron energy is located, and the translation stages used to recenter the molecule in the beam. This is an advantage of this beam scanning method relative to the point projection method described above. In particular, the scanning process can be done in situ during the coherent diffraction measurement without any reconfiguration of the sample holder or the electron beam.

While the invention has been shown and described with reference to a specific embodiment thereof, those skilled in the art will recognize that various changes in form and detail may be made herein without departing from the spirit and scope of the invention as defined by the appended claims.

The invention claimed is:

1. An electron diffraction imaging system for imaging the three-dimensional structure of a single target molecule of a sample, comprising:
    an electron source emitting a beam of electrons having a lateral coherence length of at least 15 nm in a first direction toward the sample, the electron beam being scannable across the sample in two dimensions;
    a two-dimensional electron detector that detects electrons diffracted by the sample and generates an output indicative of the spatial distribution thereof;
    a sample support on which the sample is located, the sample support being substantially transparent to electrons in a region of the support in which the sample is located; and
    a sample stage to which the sample support is mounted that is configured to provide translation of the sample support in at least two perpendicular directions and to rotate the sample to different angular orientations, said translation of the sample support being in response to diffracted electron intensity detected by the detector output while scanning the electron beam across the sample in two dimensions so as to center the target molecule in the electron beam.

2. An imaging system according to claim 1 wherein the electron beam has an operating energy between 5 keV and 30 keV.

3. An imaging system according to claim 1 wherein the electron source comprises beam conditioning optics that limit the beam diameter to no more than three times a size of the target molecule.

4. An imaging system according to claim 3 wherein the beam conditioning optics block highly divergent electrons emitted by the electron source.

5. An imaging system according to claim 1 wherein the sample stage adjusts the sample support to substantially align a center of the electron beam with a centroid of a diffraction distribution detected by the detector.

6. An imaging system according to claim 1 wherein the sample stage is controlled to maintain a sphere of confusion of less than 30 nm.

7. An imaging system according to claim 1 wherein the electron source, electron detector, sample support and sample stage are each located in an evacuated environment.

8. An imaging system according to claim 1 wherein the electron source is located in a vacuum of $10^{-9}$ mbar or less.

9. An imaging system according to claim 1 wherein the sample support is located in a vacuum of $10^{-6}$ mbar or less.

10. An imaging system according to claim 1 wherein the sample support comprises a substrate that is transparent to electrons and a rigid support structure to which the substrate is mounted.

11. An imaging system according to claim 10 wherein the rigid support structure has an opening adjacent to a region of the substrate on which the sample is located.

12. An imaging system according to claim 11 wherein a thickness of the sample support relative to a size of the support structure opening is such that, during a 360° rotation of the sample support, an angle over which the electron beam is occluded by the support structure is less than five degrees.

13. A method for imaging the three-dimensional structure of a single target molecule of a sample, the method comprising:

locating the sample on a sample support that is substantially transparent to electrons in a region of the sample support in which the sample is located, the sample support being mounted on a sample stage that is configured to allow translation of the sample support in at least two perpendicular directions and to rotate the sample to different angular orientations;

directing a beam of electrons having a lateral coherence length of at least 15 nm from an electron source in a first direction toward the sample, the electron beam being scannable across the sample support in two dimensions;

detecting electrons diffracted by the sample with a two-dimensional electron detector and generating a detector output indicative of the spatial distribution thereof; and adjusting a position of the sample support in response to diffracted electron intensity detected by the detector output while scanning the electron beam across the sample support in two dimensions so as to center the target molecule in the electron beam.

14. A method according to claim 13 wherein the electron source has an operating energy between 5 keV and 30 keV.

15. A method according to claim 13 wherein the electron source comprises beam conditioning optics that limit the beam diameter to no more than three times a size of the target molecule.

16. A method according to claim 13 wherein adjusting a position of the sample support comprises locating a centroid of a diffraction distribution detected by the detector and adjusting the sample support to substantially align the centroid with a center of the electron beam.

17. A method according to claim 13 wherein the sample stage is controlled to maintain a sphere of confusion of less than 30 nm.

18. A method according to claim 13 wherein the sample support comprises a substrate that is transparent to electrons and a rigid support structure to which the substrate is mounted, and wherein the rigid support structure has an opening adjacent to a region of the substrate on which the sample is located that is sized relative to a thickness of the sample support such that, during a 360° rotation of the sample support, an angle over which the electron beam is occluded by the support structure is less than five degrees.

* * * * *